(12) United States Patent
Chino

(10) Patent No.: US 6,897,910 B2
(45) Date of Patent: May 24, 2005

(54) ELECTRO-OPTICAL DEVICE AND ELECTRONIC APPARATUS HAVING A CONCAVE PORTION CONTAINING DEVICE ELEMENTS

(75) Inventor: Yuji Chino, Suwa (JP)

(73) Assignee: Seiko Epson Corporation (JP)

( * ) Notice: Subject to any disclaimer, the term of this patent is extended or adjusted under 35 U.S.C. 154(b) by 19 days.

(21) Appl. No.: 10/439,287

(22) Filed: May 15, 2003

(65) Prior Publication Data

US 2004/0027056 A1 Feb. 12, 2004

(30) Foreign Application Priority Data

May 15, 2002 (JP) ........................................ 2002-140334

(51) Int. Cl.[7] ........................ G02F 1/136; G02F 1/1333
(52) U.S. Cl. ........................................ 349/43; 349/158
(58) Field of Search ................................... 349/43, 158

(56) References Cited

U.S. PATENT DOCUMENTS

| | | | | |
|---|---|---|---|---|
| 5,759,879 A | * | 6/1998 | Iwasaki | 438/166 |
| 5,883,399 A | * | 3/1999 | Yin et al. | 257/66 |
| 6,091,470 A | * | 7/2000 | Fujikawa et al. | 349/122 |
| 6,433,841 B1 | * | 8/2002 | Murade et al. | 349/43 |

* cited by examiner

*Primary Examiner*—Huyen Ngo
(74) *Attorney, Agent, or Firm*—Harness, Dickey & Pierce, P.L.C.

(57) ABSTRACT

An electro-optical device is provided having high aperture ratio with which it is possible to easily planarize an insulating film stacked over a switching element, a wiring and an insulating film constituting the electro-optical device. The electro-optical device includes a substrate, a switching element, a wiring and an insulating film provided for the substrate. The substrate comprises concave portions corresponding to at least one position of the switching element, the wiring and the insulating film.

10 Claims, 9 Drawing Sheets

(h)

(i)

(j)

(k)

(l)

ELECTRO-OPTICAL DEVICE AND ELECTRONIC APPARATUS HAVING A CONCAVE PORTION CONTAINING DEVICE ELEMENTS

BACKGROUND OF THE INVENTION

1. Technical Field of the Invention

The present invention relates to an electro-optical device and also to an electro-optical device provided in an electronic apparatus.

2. Related Art

In recent years, proposals have been made as to a structure in which a planarized interlayer insulating film is provided between a thin film transistor (TFT) and a lower electrode of an organic EL element in an organic active EL emissive device. The organic active EL emissive device comprises a plurality of TFT's and a plurality of organic EL elements driven by the TFT's and arranged corresponding to the TFT's.

FIG. 10 illustrates a known example of this type of organic active emissive device.

An organic active emissive device 148 comprises a thin film transistor (TFT) 150 on a substrate 149, an organic EL element 154 including a counter electrode 151, an organic layer 152 and a lower electrode 153, and an interlayer insulating film 155. In addition, the terminal of the TFT 150 is electrically connected to the lower electrode 153 of the organic EL element 154 through a contact hole 156 made in the interlayer insulating film 155 such that the TFT 150 drives the organic EL element 154.

The thin film transistor (TFT) 150 comprises a first transistor (Tr1) 157 and a second transistor (Tr2) 158 shown in FIG. 11. Moreover, electric current passes through scanning electrode lines (Yj to Yj+n) 159, signal electrode lines (Xi to Xi+n) 160 and common electrode lines (Ci to Ci+n) 161 such that the organic layers 152 of the organic EL elements 154 are driven.

Also, capacitors 162 are formed between the common electrode lines (Ci to Ci+n) 161 and the first transistors (Tr1) 157, respectively, so as to store electric charges.

The interlayer insulating film 155 is provided over the thin film transistor (TFT) 150 and planarized at the surface contacted with the lower electrode 153.

In addition, an electro-optical device of active-matrix structure shown in FIG. 12 has been proposed as another type of conventional device.

In FIG. 12, an electro-optical device 170 of a conventional active-matrix structure comprises: a glass substrate 171; a first polysilicon layer 172 as an active layer formed on the surface of the glass substrate 171; a gate insulating film 173 formed by thermally oxidizing the poly-silicon layer 172; a second poly-silicon layer 174 as a gate electrode; a first interlayer insulating film 175; a second interlayer insulating film 176; a signal electrode line 178; a first contact hole 179; a second contact hole 180; a first pixel electrode 181; a second pixel electrode 182; and an insulating film 183.

In the electro-optical device 170 of the active-matrix structure, the insulating film 183 is formed and planarized after laminating the first poly-silicon layer 172, the gate insulating film 173, the second poly-silicon layer 174, the first interlayer insulating film 175, the second interlayer insulating film 176 and the signal electrode line 178.

In the above conventional organic active emissive device 148, needs to improve the property that insulates the lower electrode 153 from the scanning electrode line 159, the signal electrode line 160 and the thin film transistor 150 provided below the interlayer insulating film 155 in order to prevent faulty luminance of the organic EL element 154 and defects in the process of forming electrodes. Hence, it has been required to form the interlayer insulating film 155 that exhibits such sufficient insulating property.

However, it is not easy to planarize the interlayer insulating film 155 with high precision, and there has been such a problem that faulty luminance of the organic EL element and/or the defects in the process of manufacturing electrodes occur when a sufficient insulating property is not obtained.

Moreover, in the case of the above electro-optical device 170 of the active-matrix structure of another type of prior art, the insulating film 183 is formed and planarized after depositing the first pixel electrode 181; however, there has been such a problem that it is difficult to planarize the insulating film 183 to be formed over the first pixel electrode 181 because the second interlayer insulating film 176 and the first pixel electrode 181 have irregularities.

The present invention has been made in light of the above circumstances. One goal of the invention is to provide an electro-optical device having a large aperture ratio, and with which it is possible to easily planarize insulating films laminated over a switching element, a wiring and an insulating film constituting the electro-optical device.

SUMMARY

In order to achieve the above goals, the present invention provides the following means.

In an electro-optical device including a substrate, a switching element, a wiring and an insulating film which are provided over the substrate, the substrate includes a concave portion corresponding to at least one position of the switching element, the wiring and the insulating film.

In this electro-optical device, the substrate includes the concave portion corresponding to at least one position of the switching element, the wiring and the insulating film. Therefore, at least one of the switching element, the wiring and the insulating film is formed inside the concave portion, so that it is possible to easily form at least one of the switching element, the wiring and the insulating film in the concave portion.

Further, the electro-optical device of the present invention is as described above, and at least one of the switching element, the wiring and the insulating film is buried in the concave portion.

In this electro-optical device, at least one of the switching element, the wiring and the insulating film is buried in the concave portion. Therefore, at least one of the switching element, the wiring and the insulating film is buried in the concave portion, so that it is possible to easily bury at least one of the switching element, the wiring an the insulating film in the concave portion.

Further, the electro-optical device of the present invention is as described above, and a laminated member including at least one of the switching element, the wiring and the insulating film is buried in the concave portion.

In this electro-optical device, the laminated member including at least one of the switching element, the wiring and the insulating film is buried in the concave portion. Therefore, the laminated member including at least one of the switching element, the wiring and the insulating film is buried in the concave portion, so that it is possible to easily bury the laminated member including at least one of the switching element, the wiring and the insulating film in the concave portion.

In addition, of the switching element, the wiring and the insulating film, that impede light emission of the electro-optical device, the laminated member including at least one of them is buried in the concave portion. Therefore, the light-emitting area in the electro-optical device is enlarged, thereby achieving higher aperture ratio.

Moreover, the electro-optical device of the present invention is as described above, and at least one upper surface of the switching element, the wiring and the insulating film buried in the concave portion is coplanar and contiguous with the upper surface of the substrate.

In this electro-optical device, at least one upper surface of the switching element, the wiring and the insulating film buried in the concave portion is coplanar and contiguous with the upper surface of the substrate. Therefore, a flat insulating film is formed over the substrate and at least one of the switching element, the wiring and the insulating film, and it is possible to easily planarize the insulating film. Moreover, the additional process of planarizing the insulating film can be omitted. Also, when a flat surface with high precision is required on the insulating film, the planarization process with high precision can easily be performed. Moreover, it is possible to easily planarize the boundary insulating film between the pixel electrodes laminated over the insulating film.

Also, fluctuation of the insulating properties of the insulating film is restrained. At the same time, the insulating property of the insulating film can sufficiently be ensured, and the switching characteristics become stable.

Furthermore, the boundary insulating film between the pixel electrodes laminated over the insulating film can easily be planarized, so that it is possible to easily form the banks. It is also possible to prevent faulty luminance of the fluorescent member adjacent to the bank and defects in the process of forming the electrodes.

The electro-optical device of the present invention is as described above, and the boundary insulating film is formed between the first pixel electrode and the second pixel electrode adjacent to the first pixel electrode, so that the upper surface of the boundary insulating film is coplanar and contiguous with the upper surfaces of the pixel electrodes.

In this electro-optical device, the boundary insulating film is formed between the first pixel electrode and the second pixel electrode adjacent to the first pixel electrode, so that the upper surface of the boundary insulating film is coplanar and contiguous with the upper surfaces of the pixel electrodes. Therefore, a flat surface is formed over the pixel electrodes and the boundary insulating film, so that it is possible to easily planarize the upper surfaces of the pixel electrodes. Also, the banks can easily be formed on the pixel electrodes and the boundary insulating film, and it is possible to prevent the faulty luminance of the fluorescent members adjacent to the banks and defects in the process of manufacturing the electrodes. Moreover, when light-emissive layers are formed over the pixel electrodes, the thickness of each of the light-emissive layers is made uniform, thereby preventing unevenness in light-emission.

Furthermore, since the boundary insulating film is formed between the pixel electrode and the adjacent pixel electrode, the pixel electrode can be electrically insulated from the adjacent pixel electrode.

Also, the electro-optical device of the present invention is as described above, and the plurality of bar-like banks are formed extending in a predetermined direction over the pixel electrodes, and end banks extending in the direction intersecting with the bar-like banks are connected to the both ends of the bar-like banks. Also, the fluorescent member is provided in each of the spaces formed by the bar-like banks and the end banks.

In this electro-optical device, the plurality of bar-like banks are formed extending in the predetermined direction over the pixel electrodes, and the end banks extending in the direction intersecting with the bar-like banks are connected to the both ends of the bar-like banks. Moreover, the spaces formed by the bar-like banks and the end banks are provided with the fluorescent members, respectively. Therefore, the fluorescent members surrounded by the bar-like banks and the end banks constitute a rectangle column of pixels of the same color, thereby improving the aperture ratio of the electro-optical device.

Also, dimensional high precision is unnecessary for the width of the boundary insulating film provided below the bar-like bank, so that an electro-optical device can easily be formed.

Furthermore, when the solution of hole injection material or the solution of the light-emitting polymer is applied to the spaces formed by the bar-like banks and the end banks by a droplet-discharging method, highly precise alignment is unnecessary in the extending direction of the bar-like bank, thereby simplifying the process. Moreover, it is possible to improve the yield and prevent pixel defects. Evenness of the film thickness can further be improved.

Moreover, an electronic apparatus of the present invention comprises the above described electro-optical device.

According to the present invention, an electronic apparatus having desired performance characteristics can be realized.

DETAILED DESCRIPTION

Figure 1:
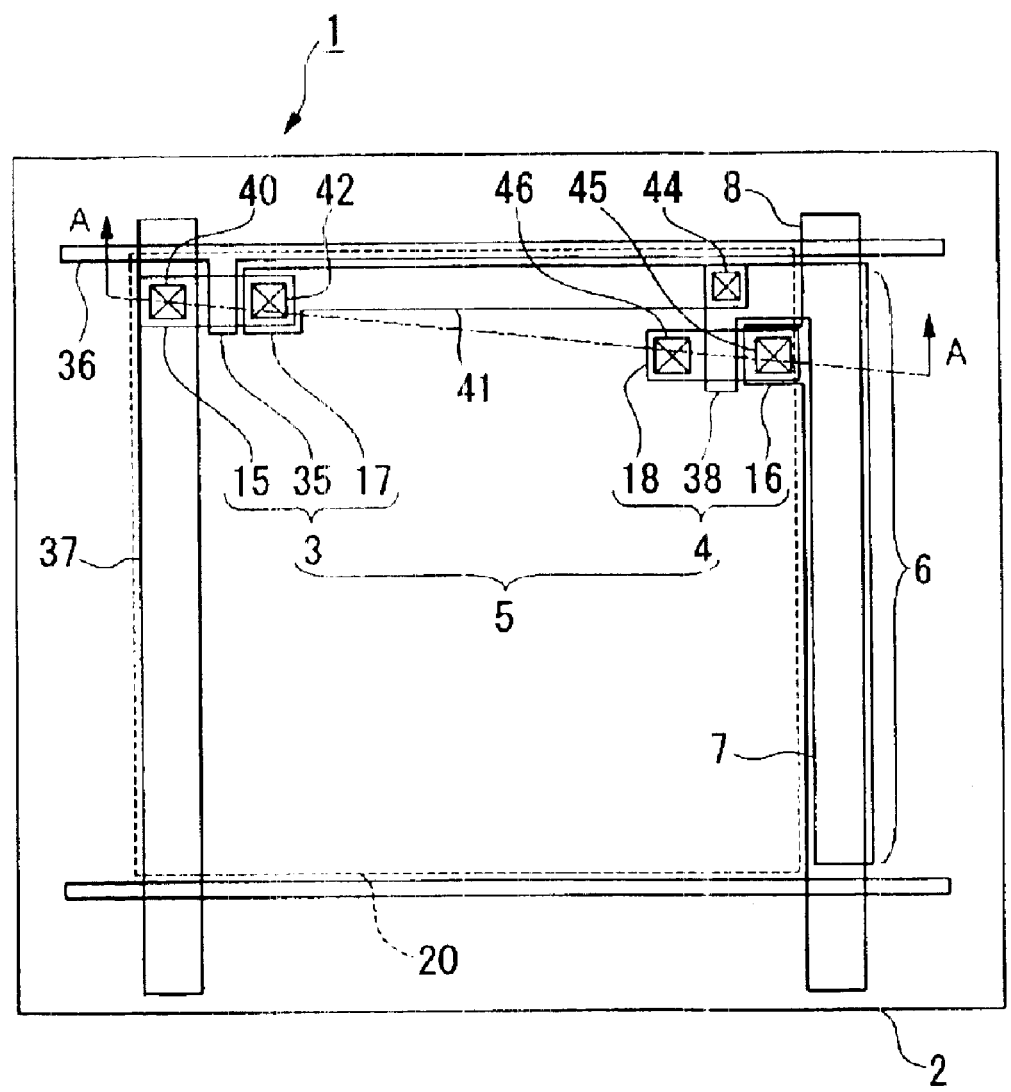
FIG. 1 is a plan view showing a part of an electro-optical device according to an embodiment of the present invention.
Figure 2:
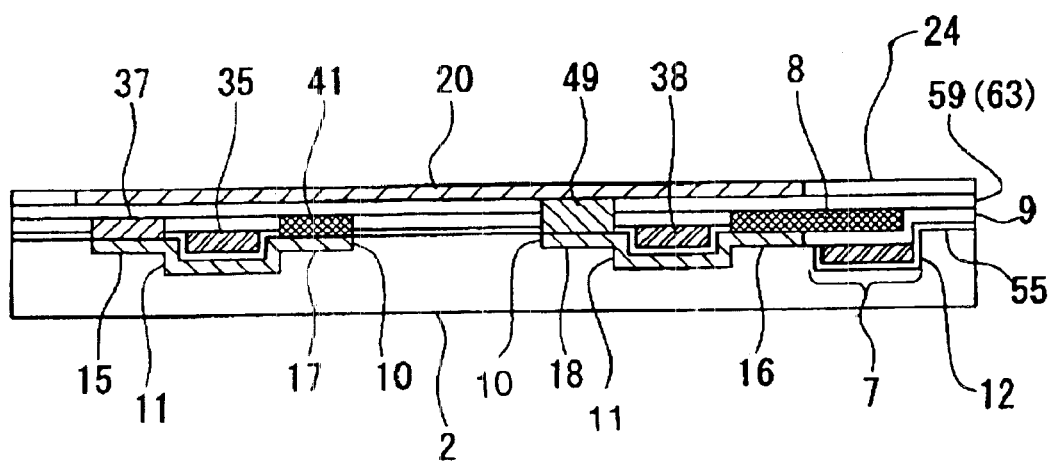
FIG. 2 illustrates the part of the electro-optical device according to the embodiment of the present invention and also is a sectional side elevation taken along A—A shown in FIG. 1.
Figure 3:
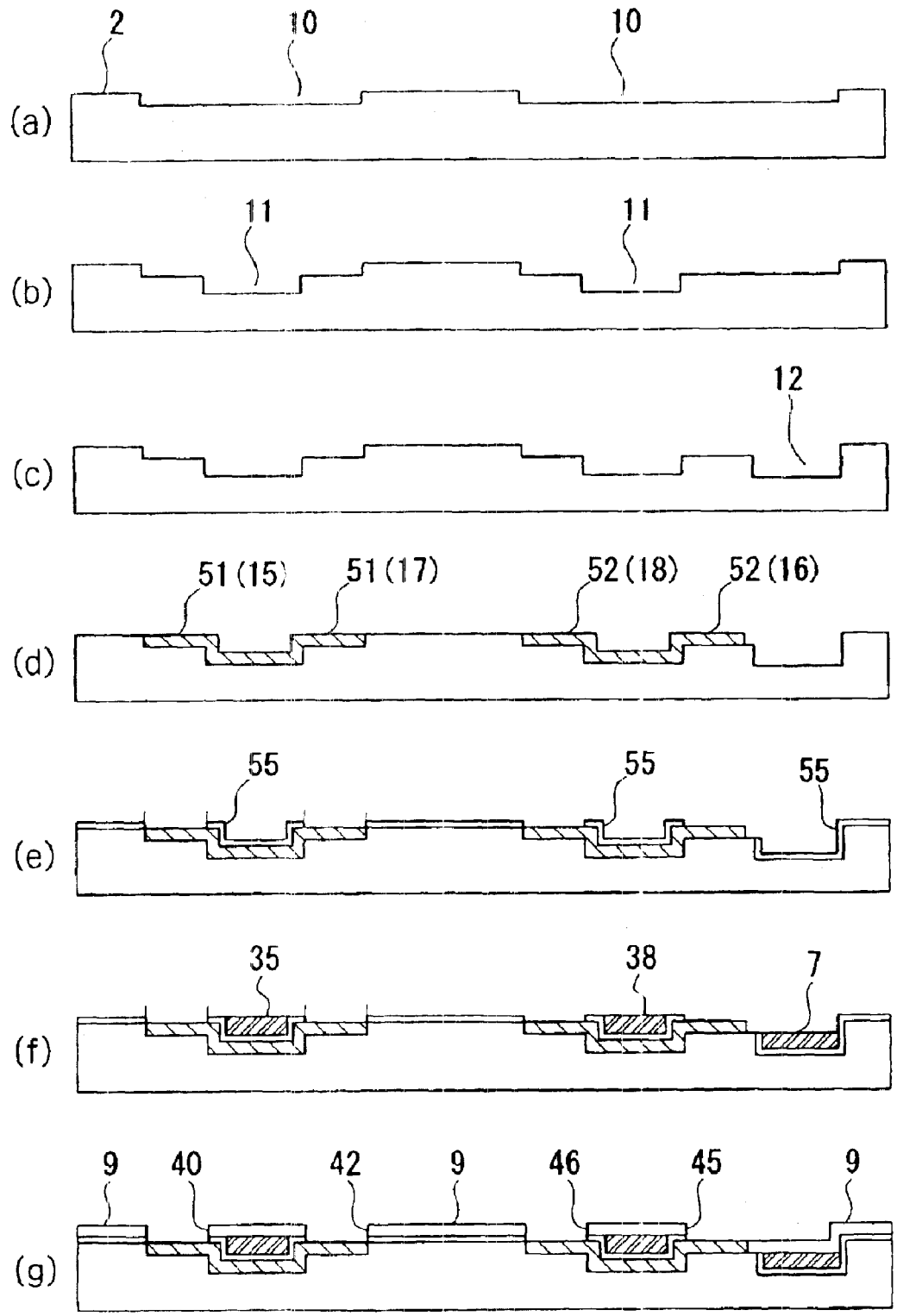
FIG. 3 illustrates a process of manufacturing the part of the electro-optical device according to the embodiment of the present invention.
Figure 4:
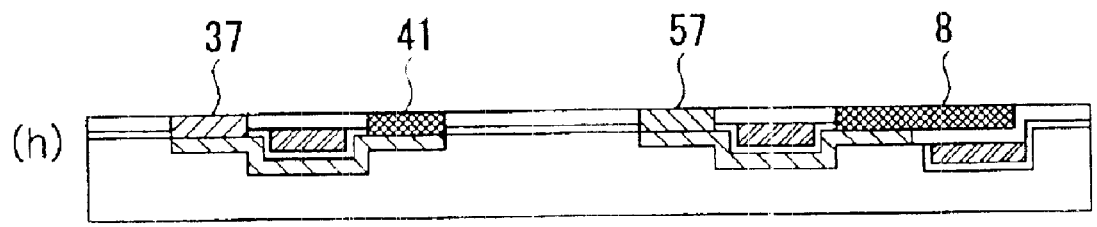
FIG. 4 illustrates the process of manufacturing the part of the electro-optical device according to the embodiment of the present invention and also is a sectional side elevation taken along A—A shown in FIG. 1.
Figure 4:
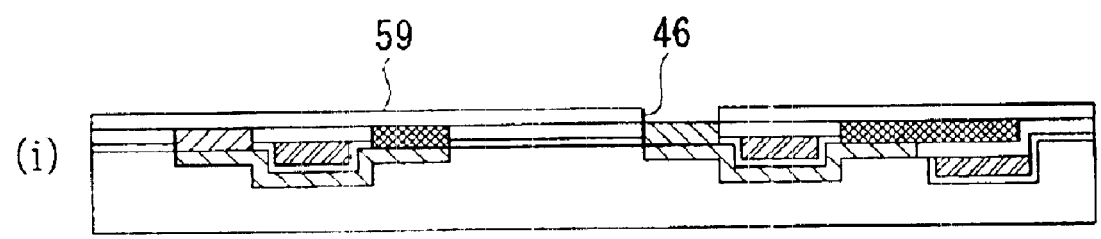
Figure 4:
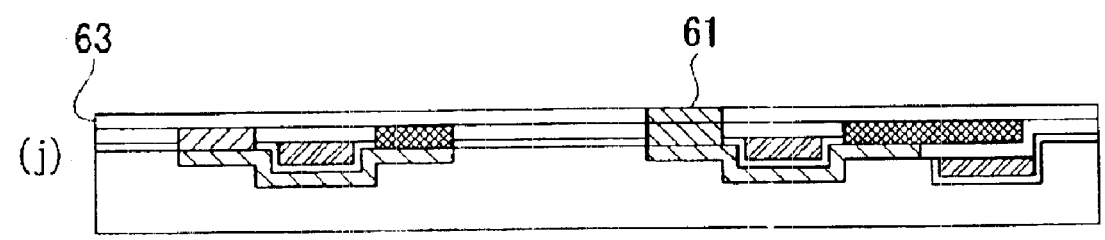
Figure 4:
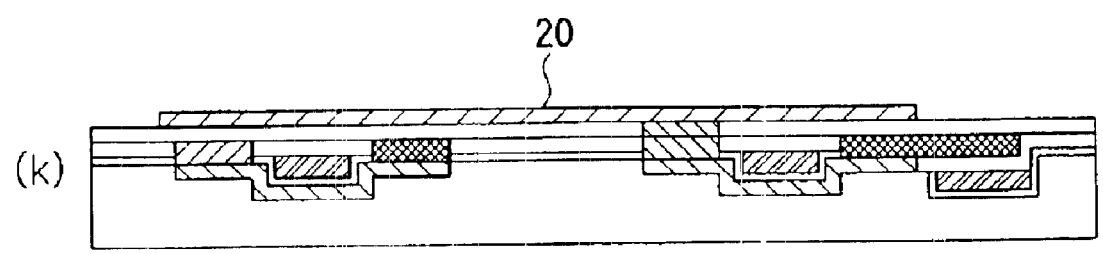
Figure 4:
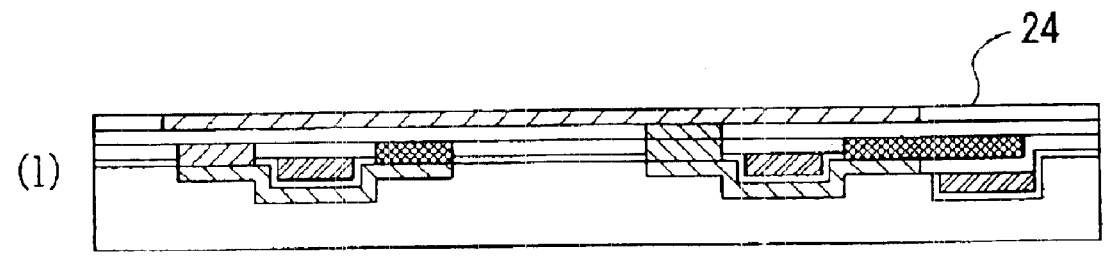
Figure 5:
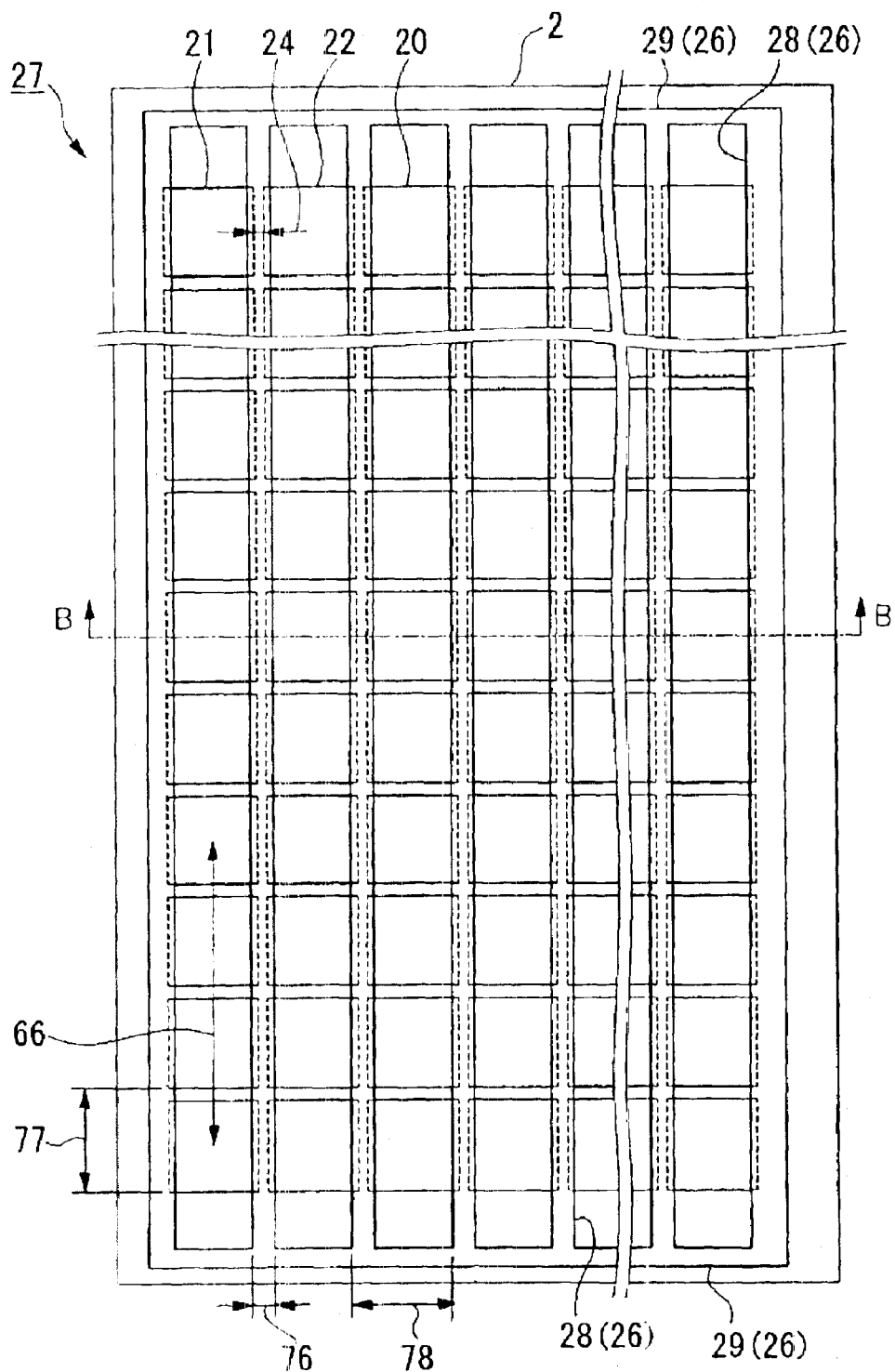
FIG. 5 is a plan view showing the electro-optical device according to the embodiment of the present invention.
Figure 6:
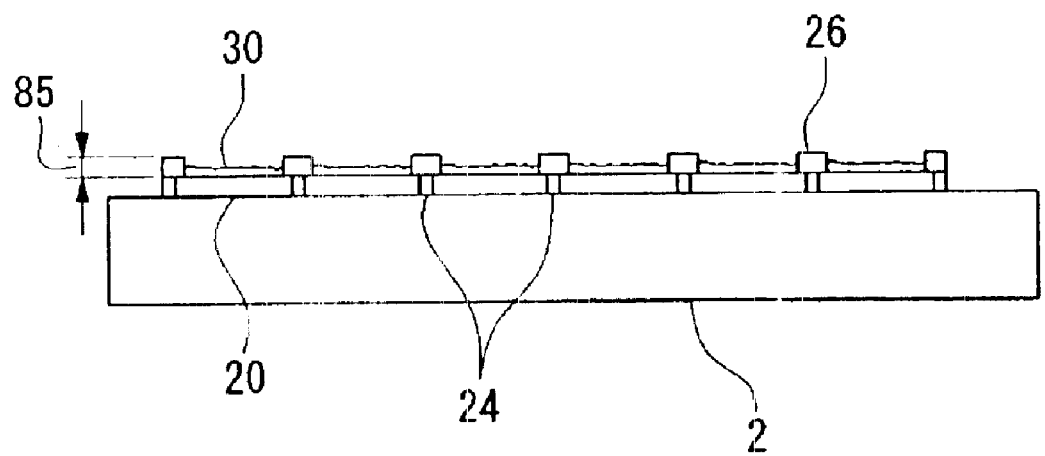
FIG. 6 illustrates the electro-optical device according to the embodiment of the present invention and also is a sectional side elevation taken along B—B shown in FIG. 5.

Hereafter, embodiments of the present invention will be explained with reference to the drawings. FIG. 1 through FIG. 6 illustrate an electro-optical device according to an embodiment of the present invention. FIG. 1 is a plan view showing part of the electro-optical device, and FIG. 2 is a sectional side elevation taken along A—A shown in FIG. 1. FIG. 3 and FIG. 4 are sectional side elevations taken along A—A shown in FIG. 1, illustrating the process of manufacturing the electro-optical device. FIG. 5 is a plan view of the electro-optical device, and FIG. 6 is a sectional side elevation taken along B—B shown in FIG. 5.

As shown in FIG. 1, the electro-optical device 1 of this embodiment comprises: a substrate 2; a switching element 5 comprised of a first TFT 3 and a second TFT 4 installed in the substrate 2; a lower electrode 7 below a retention capacitor 6 for retaining an image signal; and a first interlayer insulating film 9 for electrically insulating a common feeder wire 8 provided above the lower electrode 7 from the lower electrode 7. Here, the substrate 2 comprises concave portions 10, 11 and 12 corresponding to the positions of the switching element 5, the lower electrode 7 and the first interlayer insulating film 9.

Moreover, the switching element 5, the lower electrode 7 and the first interlayer insulating film 9 are buried in the concave portions 10, 11 and 12.

In addition, and the upper surfaces of source regions 15 and 16 and drain regions 17 and 18 of the switching element 5 buried in the concave portion 10 and 11 are coplanar and contiguous with the upper surface of the substrate 2. Moreover, the upper surface of the lower electrode 7 buried in the concave portion 12 is coplanar and contiguous with the bottom surface of the concave portion 10 corresponding to the source region 16.

Also, pixel electrodes 20 are arranged in a lattice pattern as shown in FIG. 5. A boundary insulating film 24 is formed between a first pixel electrode 21(20) and a second pixel electrode 22(20) adjacent to the first pixel electrode. (Moreover, the upper surfaces of the boundary insulating film 24, are coplanar and contiguous with those of the first pixel electrode 21(20) and the second pixel electrode 22(20).

Also, a bank 26 is formed over the pixel electrode 20. The bank 26 comprises longitudinal banks 28 and lateral banks 29. A plurality of bar-like longitudinal banks 28 are formed extending in a longitudinal direction regarding a pixel area 27, and lateral banks 29 are connected to both ends of the longitudinal banks 28, extending in a direction intersecting with the longitudinal banks 28. The spaces formed by the longitudinal banks 28 and the lateral banks 29 are provided with fluorescent members 30, respectively, as shown in FIG. 6.

A scanning signal is supplied to a gate electrode 35 of the first TFT 3 from a wiring (a gate line) 36.

The retention capacitor 6 retains potential of an image signal, which is supplied to the retention capacitor 6 through the source region 15 and the drain region 17 of the first TFT 3 connected to a data line 37.

The image signal retained by the retention capacitor 6 is supplied to a gate electrode 38 of the second TFT 4.

The pixel electrode 20 receives electric current supplied from the source region 16 and the drain region 18 of the second TFT 4 connected to the common feeder wire 8.

In the first TFT 3, the gate electrode 35 is formed as part of the wiring (gate line) 36, and the source region 15 is electrically connected to the data line 37 through a contact hole 40. Moreover, the drain region 17 is electrically connected to a drain electrode 41 through a contact hole 42.

The drain electrode 41 is electrically connected to the gate electrode 38 of the second TFT 4 and the lower electrode 7 of the retention capacitor 6. The gate electrode 38 of the second TFT 4 and the lower electrode 7 provided in the concave portion 12 are integrally formed, and the gate electrode 38 and the drain electrode 41 are electrically connected to each other through a contact hole 44.

In the second TFT 4, the source region 16 is electrically connected to the common feeder wire 8 through a contact hole 45, and the drain region 18 is electrically connected to the pixel electrode 20 through a relay electrode 49 shown in FIG. 2 provided in a contact hole 46.

Next, the method of manufacturing the electro-optical device 1 is explained referring with FIG. 3 and FIG. 4.

First of all, the substrate 2 is etched so as to form the concave portions 10 (a). The depth of each of the concave portions 10 from the surface of the substrate 2 is the same as the thickness of a polysilicon layer 51 and that of a poly-silicon layer 52 for the source regions 15 and 16 as well as for the drain regions 17 and 18. Subsequently, the substrate 2 is etched for the second time so as to from the concave portions 11 of the second step (b). The depth of each of the concave portions 11 from the surface of the substrate 2 is the same as the total thickness of the gate electrode 35 and the poly-silicon layer 51 thereunder and also as the total thickness of the gate electrode 38 and the polysilicon layer 52 thereunder. Moreover, the substrate 2 is etched for the third time so as to form a concave portion 12 of the third step (c).

The depth of the concave portion 12 from the surface of the substrate 2 is the same as the total thickness of the poly-silicon layer 52 for the source region 16, a gate insulating film 55 and the lower electrode 7.

A base protection film not shown in the figure may be provided on the etched substrate 2, as required, by plasma CVD method, using tetraethoxysilane (hereinafter referred to as TEOS) or oxygen as a source gas. On the base protection film, a semiconductor film formed of amorphous silicon is formed by, for example, a plasma CVD method and subsequently crystallized into a poly-silicon film by a crystallization process such as laser annealing or solid phase epitaxy. The poly-silicon film is patterned so as to form the poly-silicon layers 51 and 52, which serve as TFT's. The planarized surfaces are formed such that the upper surfaces of the poly-silicon layers 51 and 52 are coplanar and contiguous with the upper surface of the substrate 2 as shown in (d).

The poly-silicon layers 51 and 52 serve as the above source regions 15 and 16, respectively. They also serve as the drain regions 17 and 18, respectively. Next, the gate insulating film 55 is formed on the surfaces of the poly-silicon layers, using TEOS and oxygen as a source gas as shown in (e).

Subsequently, a conductive film made of a metal film such as aluminum, tantalum, molybdenum, titanium, or tungsten is formed by, for example, a sputtering method and then patterned so as to form the gate electrodes 35, 38 and the lower electrode 7. At this time, the wiring (gate line) 36 shown in FIG. 1 is simultaneously formed. In this state, a high concentration of phosphorus ions is implanted such that the source regions and the drain regions are formed with self-alignment toward the gate electrodes 35 and 38 as shown in (f). The portion under the gate electrodes 35 and 38 where impurities are not doped, become channel regions. Then, after depositing the first interlayer insulating film 9, the contact holes 40, 42, 45 and 46 are formed as shown in (g). Subsequently, a conductive film made of a metal film such as aluminum, tantalum, molybdenum, titanium or tungsten is formed by a sputtering method and then patterned so as to form the data line 37, the drain electrode 41, the common feeder wire 8 and a lower portion 57 of the relay electrode 49 as shown in (h).

Then, the second interlayer insulating film 59 is formed, and also the contact hole 46 for the relay electrode 49 is formed as shown in (i). Thereafter, a conductive film made of a metal film such as aluminum, tantalum, molybdenum, titanium, or tungsten is formed by a sputtering method and then patterned so as to form an upper portion 61 of the relay electrode 49 such that a planarized film 63 is formed as shown in (j). Subsequently, a metal film such as aluminum, tantalum, molybdenum, titanium or tungsten and ITO are laminated and then patterned so as to form the pixel electrode 20 (k).

Then, the boundary insulating film 24 is formed between the pixel electrode 20 and its adjacent pixel, and the upper surface of the boundary insulating film 24 is coplanar and contiguous with the upper surface of the pixel electrode 20 as shown in (l). The width of each of the boundary insulating film 24 thus formed is set to 2 $\mu$m, for example.

The parts of the electro-optical device 1 are formed as described above, so as to provide the pixel area 27 for the electro-optical device1.

Next, the bank 26 is formed so as to separate the pixel area 27 from the fluorescent members 30 and partition them.

As shown in FIG. 5, the bank 26 is formed in a stripe pattern. The material of the banks 26 is polyimide. A space 76 of the bank 26 between pixels is 4 $\mu$m, the pixel pitch 77 in the direction parallel to the bank 26 is 127 $\mu$m, the pixel pitch 78 of the bank 26 is 43 $\mu$m, and the height 85 of the bank 26 is 1.7 $\mu$m.

Subsequently, the surface of the pixel electrode 20 is treated by an oxygen plasma process so as to increase the affinity for a fluorescent substance (render the contact angle 20 degrees or less) such as a hole injection material or light-emitting polymer. Then, the affinity of the surface of the bank 26 for a fluorescent substance such as the hole injection material or the light-emitting polymer is decreased (render the contact angle 50 degrees or more) by freon-plasma process.

Thereafter, the solution of hole injection material is applied to an ellipsoidal shaped column of pixels 66, surrounding the pixel electrodes 20 with the bank 26, by droplet-discharging method. The applied solution is then dried by heat treatment and formed as a hole injection layer not shown in the figure. Red, blue and green light-emitting polymer solutions are separately applied on the hole injection layers every one of the columns of pixels 66, respectively and dried by heat treatment or by reduced-pressure treatment so as to form light-emissive layers.

Once the light emissive layers are formed, a transparent electrode is formed substantially all over the display region, thereby completing the electro-optical device 1. However, the actual device is bonded to a transparent plastic or glass substrate in order to suppress the influence of oxygen and moisture, or may be provided with a $SiO_2$ film or an organic thin film.

When the aperture ratio of the electro-optical device of the present embodiment is calculated from the size of each constituent member, it is determined that $(43-4)\times(127-2)/(127\times43)=89.3\%$, which means that a very high aperture ratio can be obtained.

When the thickness of the hole injection layer and that of the light-emitting polymer layer formed in the above manner are measured, uniformity of the film thickness is improved, compared to the conventional method, both in the direction orthogonal to the banks 26 and in the direction parallel to the banks 26.

The thus formed electro-optical device 1 comprises: the substrate 2; the switching element 5 comprised of the first TFT 3 and the second TFT 4 provided for the substrate 2; the lower electrode 7 below the retention capacitor 6 for retaining an image signal; and the first interlayer insulating film 9 for electrically insulating the common feeder wire 8 provided above the lower electrode 7 from the lower electrode 7 as shown in FIG. 1. Since the substrate 2 includes concave portions 10, 11 and 12 corresponding to the positions of the switching element 5, the lower electrode 7 and the first interlayer insulating film 9, the switching element 5, the lower electrode 7 and the first interlayer insulating film 9 are formed inside the concave portions 10, 11 and 12.

Also, the upper surfaces of the source regions 15 and 16 and those of the drain regions 17 and 18 of the switching element 5 buried in the concave portions 10 and 11 are coplanar and contiguous with the upper surface of the substrate 2. Moreover, since the upper surface of the lower electrode 7 buried in the concave portion 12 is coplanar and contiguous with the bottom of the concave portion 10 corresponding to the source region 16, the flat second interlayer insulating film 59 and the pixel electrode 20 are formed over the substrate 2, the switching element 5, the lower electrode 7 and the first interlayer insulating film 9.

Also, it is possible to easily planarize the pixel electrode 20 and the boundary insulating film 24 laminated above the first interlayer insulating film 9 and the gate insulating film 55.

Furthermore, the pixel electrodes 20 are arranged in a lattice pattern as shown in FIG. 5. The boundary insulating film 24 is formed between the first pixel electrode 21(20) and the second pixel electrode 22(20) adjacent to the first pixel electrode 21(20). Since the upper surface of the boundary insulating film 24 is coplanar and contiguous with the upper surfaces of the first pixel electrode 21(20) and the second pixel electrode 22(20), a flat surface is formed over the boundary insulating film 24 and the first pixel electrode 21(20) and the second pixel electrode 2(20). Moreover, the boundary insulating film 24 is formed between the first pixel electrode 21 (20) and the second pixel electrode 22(20).

Furthermore, the bank 26 is formed on the pixel electrodes 20. The plurality of bar-like longitudinal banks 28 are formed in the direction longitudinal to the pixel area 27, and the lateral banks 29 are connected to both ends of the longitudinal banks 28, extending in the direction intersecting with the longitudinal banks 28. Since the fluorescent members 30 are provided as shown in FIG. 6 in the spaces formed by the longitudinal banks 28 and the lateral banks 29, respectively, the fluorescent members 30 surrounded by the longitudinal banks 28 and the lateral banks 29 constitute the rectangle column of pixels 66 of the same color.

Also, dimensional high precision is unnecessary for the width of the boundary insulating film 24 below the longitudinal bank 28.

Furthermore, when the solution of the hole injection material or the solution of the light-emitting polymer is applied by the droplet-discharging method to the spaces formed by the longitudinal banks 28 and the lateral banks 29, high precision in alignment is unnecessary in the extending direction of the longitudinal banks 28.

As described above, the electro-optical device 1 comprises: the substrate 2; the switching element 5 comprised of the first TFT 3 and the second TFT 4 provided for the substrate 2; the lower electrode 7 provided below the retention capacitor 6 for retaining an image signal; and the first interlayer insulating film 9 for electrically insulating the lower electrode 7 from the common feeder wire 8 provided above the lower electrode 7. Since the substrate 2 comprises concave portions 10, 11 and 12 corresponding to the positions of the switching element 5, the lower electrode 7 and the first interlayer insulating film 9, it is possible to form the switching element 5, the lower electrode 7 and the first interlayer insulating film 9 in the concave portions 10, 11 and 12.

Moreover, since the concave portions are provided, the switching element 5, the lower electrode 7 and the first interlayer insulating film 9 can readily be buried in those concave portions.

Also, the upper surfaces of the source regions 15 and 16 and those of the drain regions 17 and 18 of the switching element 5 buried in the concave portions 10 and 11 are coplanar and contiguous with the upper surface of the substrate 2. Moreover, the upper surface of the lower electrode 7 buried in the concave portion 12 is coplanar and contiguous with the bottom of the concave portion 10 corresponding to the source region 16. Therefore, the flat first interlayer insulating film 9 and the flat gate insulating film 55 are formed over the substrate 2, the switching element 5, the lower electrode 7 and the first interlayer insulating film 9. Consequently, it is possible to easily planarize the first interlayer insulating film 9 and the gate insulating film 55 and also to omit an additional process for planarizing the first interlayer insulating film 9 and the gate insulating film 55. Moreover, when a flat surface with high precision is required over the first interlayer insulating film 9 and the gate insulating film 55, it is possible to easily planarize the surface with high precision and also to easily planarize the pixel electrode 20 and the boundary insulating film 24 laminated over the first interlayer insulating film 9 and the gate insulating film 55.

Furthermore, it is possible to restrain the fluctuation of the insulating properties of the first interlayer insulating film 9 and the gate insulating film 55 and also to prevent the switching characteristics of the switching elements 5 from varying.

It is also possible to ensure sufficient insulating properties of the first interlayer insulating film 9 and the gate insulating film 55, and thereby the switching characteristics of the switching elements 5 become stable.

In addition, since it is possible to easily planarize the pixel electrode 20 and the boundary insulating film such as the boundary insulating film 24 laminated over the first interlayer insulating film 9 and the gate insulating film 55, the banks 26 can easily be formed. Also, it is possible to prevent faulty luminance of the fluorescent member 30 adjacent to the bank 26 and the defects in the process of manufacturing the electrodes.

Moreover, the pixel electrodes 20 are formed in a lattice pattern as shown in FIG. 5, and the boundary insulating film 24 is formed between the first pixel electrode 21 (20) and the second pixel electrode 22 (20) adjacent to the first pixel electrode 21 (20). Moreover, since the upper surface of the boundary insulating film such as the boundary insulating film 24 is coplanar and contiguous with the upper surfaces of the first pixel electrode 21 (20) and the second pixel electrode 22(20), a flat surface is formed over the boundary insulating film 24, and the first pixel electrode 21 (20) and the second pixel electrode 22(20). Therefore, it is easy to planarize the upper surface of the boundary insulating film 24 and the upper surfaces of the first pixel electrode 21(20) and the second pixel electrode 22(20). Furthermore, it is possible to easily form the banks 26 over the boundary insulating film 24, the first pixel electrode 21(20) and the second pixel electrodes 22(20). Also, it is possible to prevent faulty luminance of the fluorescent members 30 adjacent to the banks 26 and the defects in the process of manufacturing the electrodes. Moreover, when light-emissive layers are formed on the pixel electrodes, the thickness of each of the light-emissive layers is made uniform, so that unevenness in light emission is prevented.

Also, since the boundary insulating film 24 is formed between the first pixel electrode 21(20) and the second pixel electrode 22(20), the fist pixel electrode 21 (20) can be electrically insulated from the second pixel electrode 22 (20).

Furthermore, the banks 26 are formed on the pixel electrodes 20. The plurality of bar-like longitudinal banks 28 are formed extending in the direction longitudinal to the pixel area 27, and the lateral banks 29 are connected to both ends of the longitudinal banks 28 in the direction intersecting with the longitudinal banks 28. Since the spaces formed by the longitudinal banks 28 and the lateral banks 29 are provided with the fluorescent members 30 as shown in FIG. 6, respectively, the fluorescent members 30 surrounded by the longitudinal banks 28 and the lateral banks 29 constitute the rectangle column of pixels 66 of the same color, so that the aperture ratio of the electro-optical device 1 can be improved.

Also, high precision is unnecessary for forming the width of the boundary insulating film 24 provided below the longitudinal bank 28, so that the electro-optical device 1 can easily be formed.

When the solution of the hole injection material or the solution of the light-emitting polymer is applied by the droplet-discharging method to the spaces formed by the longitudinal banks 28 and the lateral banks 29, high precision in alignment is unnecessary in the extending direction of the longitudinal banks 28, thereby simplifying the process. Also, yield can be improved, and the defects in the pixels are prevented. Moreover, the film thickness can further be uniform.

The following explains an example of an electronic apparatus provided with the above electro-optical device.

Figure 7:
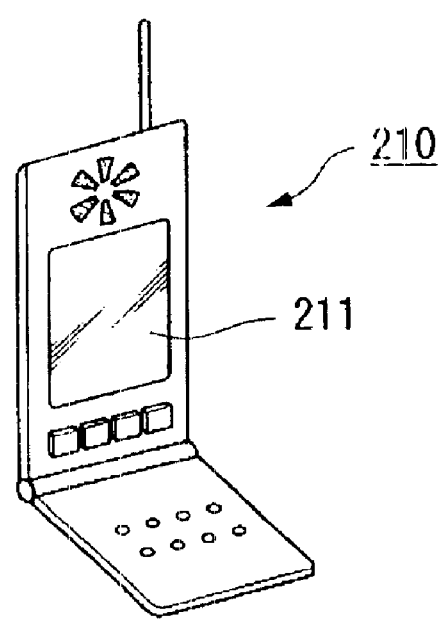
FIG. 7 illustrates an electronic apparatus to which the electro-optical device of the present invention is mounted.

FIG. 7 is a perspective view illustrating an example of a cellular phone. FIG. 7 illustrates a main body 210 of the cellular phone and a display portion 211 using the above organic EL electro-optical device.

Figure 8:
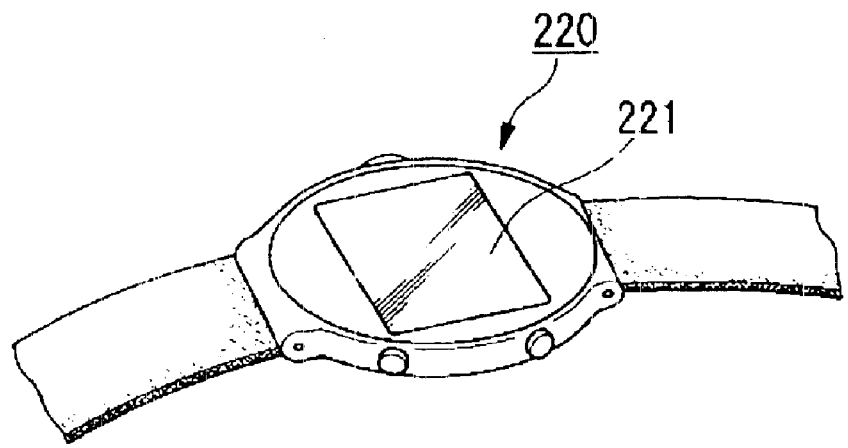
FIG. 8 illustrates an electronic apparatus to which the electro-optical device of the present invention is mounted.

FIG. 8 is a perspective view illustrating an example of a wristwatch-type electronic apparatus. FIG. 8 illustrates a main body 220 of the watch and a display unit 221 using the above electro-optical device.

Figure 9:
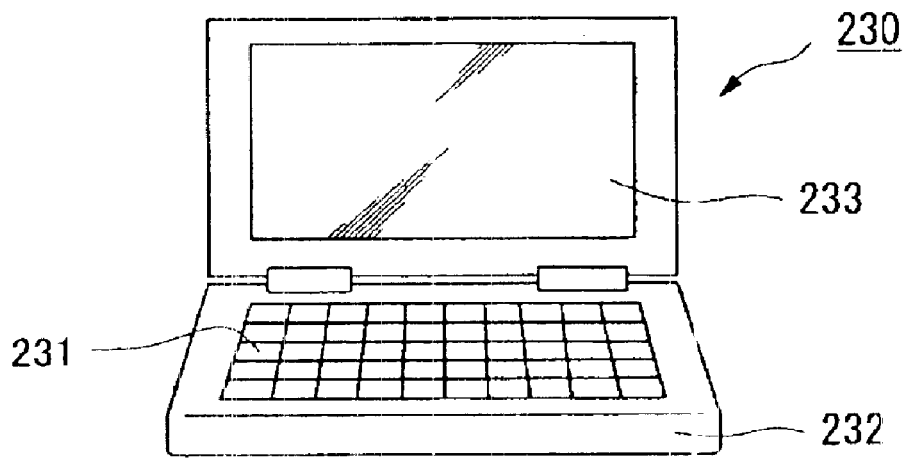
FIG. 9 illustrates an electronic apparatus to which the electro-optical device of the present invention is mounted.
Figure 10:
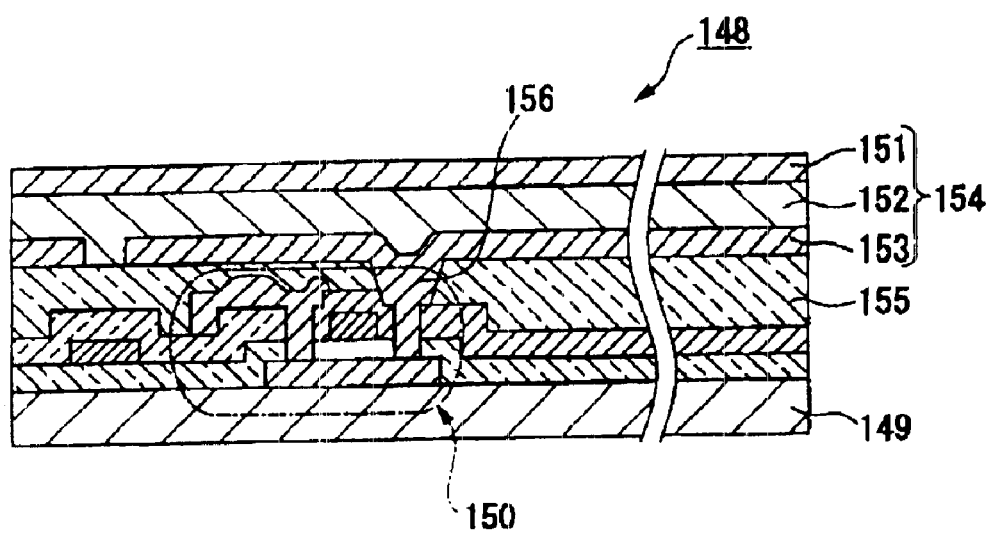
FIG. 10 is a sectional side elevation illustrating a part of an organic active emissive device shown as an example of a conventional organic active emissive device.
Figure 11:
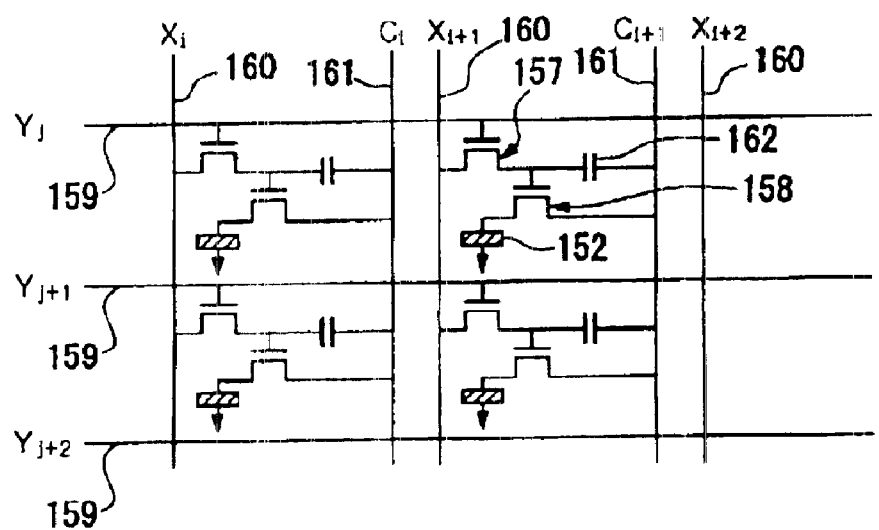
FIG. 11 is a circuit diagram of the part of the organic active emissive device shown as the example of the conventional active emissive device.
Figure 12:
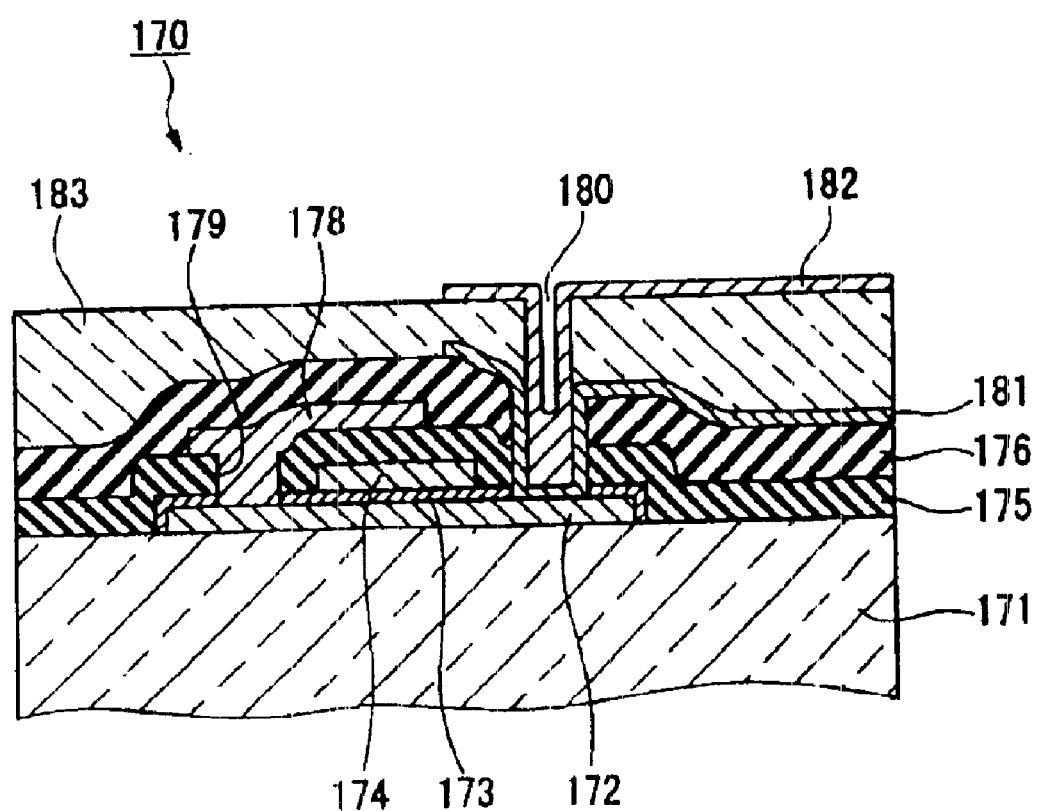
FIG. 12 is a sectional side elevation illustrating a part of an active-matrix structure shown as another type of prior art.

FIG. 9 is a perspective view illustrating an example of a mobile information processing apparatus such as a word processor and a personal computer. FIG. 9 illustrates an information processing apparatus 230, an input unit 231 such as keyboard, a main body 232 of the information processing apparatus, and a display unit 233 using the electro-optical device.

Since the electronic apparatuses shown in FIG. 7 through FIG. 9 comprise the electro-optical device 1 of the above embodiment, it is possible to realize the electronic apparatuses which are superior in display quality and provided with the display unit of a bright screen.

The electro-optical device 1 of the above embodiment comprises: the substrate 2; the switching element 5 comprised of the first TFT 3 and the second TFT 4 provided for the substrate 2; the lower electrode 7 provided below the retention capacitor 6 for retaining an image signal; and the first interlayer insulating film 9 for electrically insulating the common feeder wire 8 provided above the lower electrode 7 from the lower electrode 7. In this electro-optical device, the substrate 2 comprises the concave portions 10, 11 and 12 corresponding to the positions of the switching element 5, the lower electrode 7 and the first interlayer insulating film 9. However, a laminated member including at least one of the switching element 5, the lower electrode 7 and the first interlayer insulating film 9 may be buried in the concave portions 10, 11 and 12.

According to the configuration, the laminated member including at least one of the switching element 5, the lower electrode 7 and the first interlayer insulating film 9 is buried in the concave portions 10, 11 and 12. Further, the laminated member comprising at least one of the switching element 5, the lower electrode 7 and the first interlayer insulating film 9 impede the light emission of the electro-optical device 1, is buried in the concave portions 10, 11 and 12. Consequently, the light-emitting area in the electro-optical device 1 is enlarged, and it is possible to achieve the higher aperture ratio.

Furthermore, in the electro-optical device 1, the banks 26 are formed on the pixel electrodes 20, and the plurality of bar-like longitudinal banks 28 are formed extending in the direction longitudinal to the pixel area 27, and the lateral banks 29 are connected to both ends of the longitudinal banks 28 in the direction intersecting with the longitudinal banks 28. The spaces formed by the longitudinal banks 28 and the lateral banks 29 are provided with the fluorescent members 30, respectively, as shown in FIG. 6. However, depending on the driving method of the electro-optical device 1, the fluorescent member 30 may be provided in each of the spaces formed by the plurality of bar-like banks extending in the direction lateral to the pixel area 27 and the banks extending in the longitudinal direction at the ends of the bar-like banks.

Moreover, polyimide is employed as the material of the banks 26 shown in FIG. 5 in the above embodiment. However, the material is not limited to polyimide and may be anything as long as the material can be made lyophobic by getting fluorinated by plasma treatment in the atmospheric pressure or in the reduced pressure.

ADVANTAGE OF THE INVENTION

In the electro-optical device as described above, the substrate includes a concave portion corresponding to a location of at least one of the switching element, the wiring and the insulating film. Therefore, at least one of the switching element, the wiring and the insulating film is formed in the concave portion, so that there is an advantage that at least one of the switching element, the wiring and the insulating film can easily be formed inside the concave portion.

Moreover, the laminated member including at least one of the switching element, the wiring and the insulating film is buried in the concave portion. Therefore, the laminated member including at least one of the switching element, the wiring and the insulating film is buried in the concave portion, so that there is an advantage that the laminated member including at least one of the switching element, the wiring and the insulating film can easily be formed in the concave portion.

Also, the laminated member including at least one of the switching element, the wiring and the insulating film impede the light emission of the electro-optical device, is buried in the concave portion, so that there is an advantage that the light-emitting area in the electro-optical device is enlarged, and the aperture ratio is increased.

Furthermore, at least one upper surface of the switching element, the wiring and the insulating film buried in the concave portion is coplanar and contiguous with that of the substrate. Therefore, a flat insulating film is formed over the substrate, the switching element, the wiring and the insulating film, so that there is an advantage that the insulating film can easily be planarized and an additional process of planarizing the insulating film can be omitted. When a flat surface is required on the insulating film, there is an advantage that the film can easily be planarized. It is also advantageous that the boundary insulating film between the pixel electrodes laminated on the insulating film can easily be planarized.

Also, there is an advantage that it is possible to restrain fluctuation of the insulating properties of the insulating film and to prevent the switching characteristics of the switching elements from varying.

Moreover, there is an advantage that the insulating property of the insulating film can be sufficiently ensured, and the switching characteristics become stable.

Since the boundary insulating film between the pixel electrodes laminated on the insulating film can easily be planarized, there is an advantage that the banks can be easily formed. It is also advantageous that it is possible to prevent faulty luminance of the fluorescent members adjacent to the banks and the defects in the process of forming the electrodes.

Furthermore, the boundary insulating film is formed between the first pixel electrode and the second pixel electrode adjacent to the first pixel electrode, and the upper surface of the boundary insulating film is coplanar and contiguous with those of the pixel electrodes. Therefore, a flat surface is formed over the pixel electrodes and the boundary insulating film, so that there is an advantage that the upper surface of the pixel electrode can easily be planarized. Also, there is an advantageous that the banks can easily be formed over the pixel electrodes and the boundary insulating films. Moreover, it is possible to prevent the faulty luminance of the fluorescent members adjacent to the banks and the defects in the process of manufacturing the electrodes, as another advantage. When the light-emissive layers are formed over the pixel electrodes, the thickness of each of the light-emissive layers is advantageously made uniform, thereby preventing unevenness in light emission.

Also, since the boundary insulating film is formed between the pixel electrode and the pixel electrode adjacent to the pixel electrode, the pixel electrode can be electrically insulated from the adjacent pixel electrode as another advantage.

Also, the plurality of bar-like banks are formed extending in the predetermined direction over the pixel electrodes, and the end banks extending in the direction intersecting with the bar-like banks are connected to the both ends of the bar-like banks. Moreover, fluorescent member is provided in each of the spaces formed by the bar-like banks and the end banks. Therefore, the fluorescent members surrounded by the bar-like banks and the end banks constitute a rectangle column of pixels of the same color, so that there is an advantage that the aperture of the electro-optical device is improved.

Also, dimensional high precision is unnecessary for the width of the boundary insulating film provided below the bar-like banks, so that the electro-optical device can easily be manufactured.

When the solution of the hole injection material or the solution of light-emitting polymer is applied to the spaces formed by the bar-like banks and the end banks by the droplet-discharging method, highly precise alignment is not necessary in the extending direction of the bar-like banks, thereby simplifying the process. Also, there is an advantage that it is possible to improve the yield, prevent the pixel defects and enhance uniformity of film thickness.

Moreover, an electronic apparatus having desired performances can advantageously be obtained.

The entire disclosure of Japanese Patent Application No. 2002-140334 filed May 15, 2002 is incorporated by reference.

What is claimed is:

1. An electro-optical device comprising:

a substrate; and a switching element, a wiring and an insulating film, which are provided on the substrate;

wherein the substrate includes a concave portion corresponding to a position of at least one of the switching element, the wiring and the insulating film;

wherein a plurality of bar-like banks are formed extending in a predetermined direction over pixel electrodes, and end banks are connected to both ends of the bar-like banks extending in a direction intersecting with the bar-like banks such that spaces formed by the bar-like banks and the end banks are provided with fluorescent members.

2. The electro-optical device according to claim 1, wherein at least one of the switching element, the wiring and the insulating film is positioned in the concave portion.

3. The electro-optical device according to claim 2, wherein at least one upper surface of at least one of the switching element, the wiring and the insulating film is coplanar and contiguous with an upper surface of the substrate.

4. The electro-optical device according to claim 1, wherein a laminated member including at least one of the switching element, the wiring and the insulating film is positioned in the concave portion.

5. The electro-optical device according to claim 1, wherein a boundary insulating film is formed between a first pixel electrode and a second pixel electrode adjacent to the first pixel electrode such that an upper surface of the boundary insulating film is coplanar and contiguous with upper surfaces of the pixel electrodes.

6. An electronic apparatus comprising the electro-optical device according to claim 1.

7. An electro-optical device comprising:

a substrate including a concave portion formed therein; and a switching element provided on the substrate;

a wiring provided on the substrate; and an insulating film provided on the substrate;

wherein the concave portion corresponds to a location of at leapt one of the switching element, the wiring and the insulating film;

wherein a plurality of bar-like banks are formed extending in a predetermined direction over pixel electrodes, and end banks are connected to both ends of the bar-like banks extending in a direction intersecting with the bar-like banks such that spaces formed by the bar-like banks and the end banks are provided with fluorescent members.

8. The electro-optical device according to claim 7, wherein at least one of the switching element, the wiring and the insulating film is positioned in the concave portion.

9. The electro-optical device according to claim 8, wherein an upper surface of the at least one of the switching element, the wiring and the insulating film that is positioned in the concave portion is coplanar and contiguous with an upper surface of the substrate.

10. The electro-optical device according to claim 7, wherein at least one of the switching element, the wiring and the insulating film is formed as part of a laminated member and the laminated member is positioned in the concave portion.

* * * * *